United States Patent [19]

Van Vonno

[11] 4,067,038

[45] Jan. 3, 1978

[54] SUBSTRATE FED LOGIC AND METHOD OF FABRICATION

[75] Inventor: Nicolaas W. Van Vonno, Melbourne, Fla.

[73] Assignee: Harris Corporation, Cleveland, Ohio

[21] Appl. No.: 753,027

[22] Filed: Dec. 22, 1976

[51] Int. Cl.² .................... H01L 27/02; H01L 29/34
[52] U.S. Cl. ...................................... 357/46; 357/52; 357/89; 357/90
[58] Field of Search ........................ 357/46, 52, 89, 90

[56] References Cited

U.S. PATENT DOCUMENTS 4,007,474  2/1977  Yagi et al. .............. 357/90

OTHER PUBLICATIONS

IBM-Tech. Bul. —vol. —, No. 6, Nov. 1970, P. 1740, H. Ghosh.
IBM-Tech. Bul. —vol. 11, No. 10, Mar. 1969, pp. 1342-1343, Viva et al.

*Primary Examiner*—Edward J. Wojciechowicz
*Attorney, Agent, or Firm*—Leitner, Palan & Martin

[57] ABSTRACT

An integrated circuit having a substrate of a first conductivity type, a first layer of opposite conductivity type thereon and a second layer of said first conductivity type inversely graded on said first layer and including a heavily doped region adjacent the surface opposite said first layer. A ring of said opposite conductivity type extends through said second layer and partially into said first layer and a diffused region of said opposite conductivity type is in the surface of said second layer.

The method of fabrication includes epitaxially forming said first layer on said substrate, expitaxially forming said second layer on said first layer having a decreasing impurity concentration from the P-N junction to the surface, forming said ring, nonselectively diffusing to increase the impurity concentration at the area adjacent the surface of said second layer and selectively diffusing to form said diffused surface region.

4 Claims, 4 Drawing Figures

SUBSTRATE FED LOGIC AND METHOD OF FABRICATION

BACKGROUND OF THE INVENTION

1. Field of the Invention

The invention relates generally to substrate fed logic and more particularly to an improved substrate fed logic and method of fabrication.

2. Description of the Prior Art

In the field of bipolar large scale integration circuits, the use of integrated injection logic (I²L) provided a low power, high density circuit. The next stage of development was the use of substrate fed logic (SFL). The advantages of substrate fed logic over integrated injection logic is described in an article entitled "Substrate Fed Logic" by Victor Blatt et al in IEEE Journal of Solid-State Circuits, Volume SC-10, PP 336 through 342, October, 1975. The circuits of the prior art have generally been fabricated using processes of great complexity. Similarly, the final product has not produced the performance characteristics desired.

SUMMARY OF THE INVENTION

The present invention provides an improved method of fabricating and structure of substrate fed logic wherein a substrate of a first conductivity type has a first layer of an opposite conductivity type and a second layer of the first conductivity type stacked thereon. The second layer has a substantially linear impurity gradient decreasing from its boundary with the first layer to an area adjacent the opposite surface which is heavily doped with impurities. A ring of said opposite conductivity type extends through the second layer and partially into the first layer to define the domain of a pair of bipolar transistors. The second layer also includes a diffused region of the opposite conductivity type at its surface and within said ring. The substrate, first layer and second layer are the emitter, base, and collector, respectively, of a first transistor, and the first layer, second layer, and diffused surface region are the emitter, base, and collector of a second transistor.

The method of fabrication begins with epitaxially forming upon the substrate of a first conductivity type a first layer of opposite conductivity type. A second epitaxial layer is formed on the first layer having a linear gradient of the first conductivity type impurities, decreasing in impurity concentration from the boundary with the first layer to the opposite surface. A ring of opposite conductivity type is formed by diffusion through the second epitaxial layer and partially into the first epitaxial layer. By nonselective diffusion, impurities of the first conductivity type are introduced into the surface of the second layer to increase the impurity concentration. Finally, impurities of the conductivity type are selectively diffused into the surface of the second layer to form a surface region of the opposite conductivity type within the ring. The second epitaxial layer may be a linear gradient of a plurality of discrete steps or may be a continuously varying linear gradient of impurity concentration. While the heavily doped surface of the second epitaxial layer prevents an inversion of the layer, the graded dopant profile of the second layer improves the upward gain of the second bipolar transistor.

OBJECTS OF THE INVENTION

An object of the present invention is to provide an improved form of bipolar substrate fed logic that features high performance using simple and low cost processing techniques.

Another object of the present invention is to provide a pair of complementary bipolar transistors in the substrate fed logic arrangement with improved upward gain of the NPN device in the pair.

A further object of the invention is to provide a substrate fed logic circuit wherein the regions formed in the two epitaxial layers above the substrate are by diffusion including two selective and one nonselective diffusion.

Other objects, advantages, and novel features of the present invention will become apparent from the following detailed description of the invention when considered in conjunction with the accompanying drawings.

DESCRIPTION OF THE PREFERRED EMBODIMENTS

Figure 1:
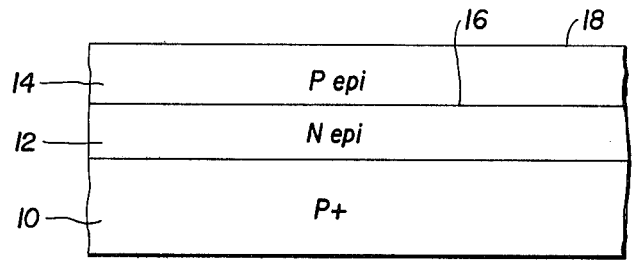
FIGS. 1 through 3 are sectional views showing the various steps of the method embodying the present invention for making a pair of bipolar transistor in substrate fed logic.

Method for fabricating the substrate fed logic integrated circuit of the present invention begins as illustrated in FIG. 1 with a substrate 10, being for example a P+ substrate having an impurity concentration of approximately $2 \times 10^{18}$ atoms per cubic centimeter, a thickness of approximately 500 microns grounded to about 200 microns, and a bulk resistance of approximately 0.01 ohm-centimeters. A first epitaxial layer 12 is grown therein, being, for example, of N-type conductivity having an impurity concentration of approximately $1 \times 10^{17}$ atoms per cubic centimeter, a thickness of approximately 3 microns and a bulk resistance of aproximately 0.1 ohm-centimeters. A second epitaxial layer 14 is grown on the first epitaxial layer 12 to have a P-type conductivity being approximately 3 microns thick and having a bulk resistivity of 3 to 5 ohm-centimeter. The second epitaxial layer 14 is a graded epitaxial layer having a decreasing impurity concentration of from approximately 5 to $6 \times 10^{15}$ atoms per cubic centimeter at the boundary 16 with the first epitaxial layer 12 to an impurity concentration of approximately $1 \times 10^{15}$ atoms per cubic centimeter at the opposite surface 18. The linear gradient may be produced by a plurality of discrete steps or layers of modification or may be produced by a continuously varying impurity concentration. It should be noted that the gradient doping profile of the P epitaxial layer 14 improves the upward gain of the NPN bipolar transistor to be formed wherein layer 12 will comprise the emitter and layer 14 will be the base which will include a diffused collector.

The process continues with the modification of the epitaxial layers to form emitter contacts and collector regions and to provide a modification of the surface to prevent inversion. The surface 18 of the second epitaxial layer 14 is masked and delineated by well-known techniques including, for example, providing an oxide and photoresist layers, and exposing the photoresist and etching to remove portions of the oxide and photoresist to expose the desired diffusion site of surface 18. The delineation will produce an opening through which N type impurities, for example phosphorous, are disposed by chemical vapor deposition and diffused to a depth which exceeds the width of the first epitaxial layer 14 and extends down and partially into the first epitaxial layer 14. The ring 20 will have an impurity concentration of, for example, $1 \times 10^{19}$ atoms per cubic centimeter, a depth of, for example, 3 microns and resistance of approximately 0.007 ohm-centimeters. The temperature of the ring diffusion causes epitaxial layer 14 to diminish in width and thus a 3 micron diffusion depth will expand into epitaxial layer 12.

Figure 2:
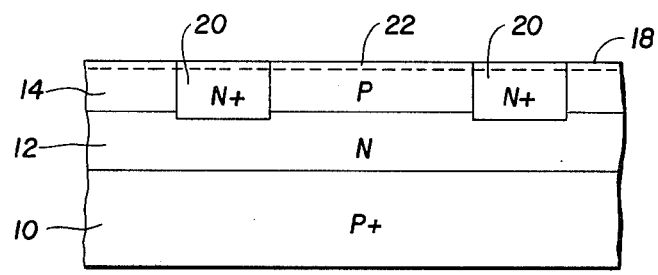

Following the ring 20 deposition and diffusion, the mask is removed and a nonselective diffusion and deposition of P+ impurities, for example, boron, into the surface 18 of the second epitaxial layer is performed. The deposition and diffusion will provide a surface area 22 having a depth of 0.3 microns and increases the impurity concentration of surface 18 to approximately $5 \times 10^{18}$ to $1 \times 10^{19}$ atoms per cubic centimeter. The surface area 22 prevents inversion of the surface 18 of the P epitaxial layer 14. The semiconductor substrate at this point in the process is illustrated in FIG. 2. The final surface modification process step of the present fabrication includes a shallow N+ diffusion through a mask of, for example, phosphorous, to form region 24 in the surface of the epitaxial layer 14. Region 24 has an impurity concentration of $5 \times 10^{19}$ atoms per cubic centimeter, a depth of approximately 2 microns and a sheet resistance of 3 ohms per square. The final structure is illustrated in FIG. 3.

Figure 3:
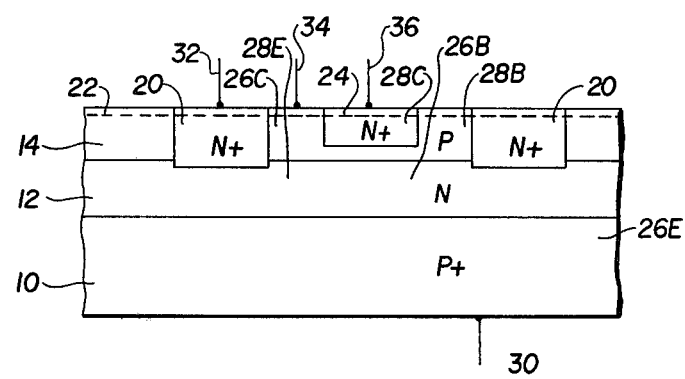
Figure 4:
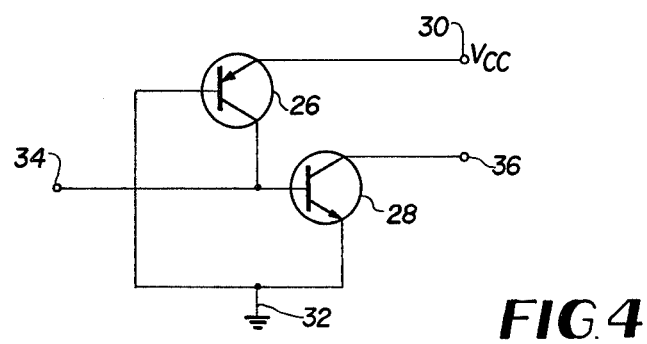
FIG. 4 is an electrical schematic of the circuit of the semiconductor structure of FIG. 3.

Schematic representation of the circuit of the semiconductor structure in FIG. 3 is illustrated in FIG. 4 as including a first transistor 26 and a second transistor 28. The emitter of the first transistor 26 is connected to a biasing voltage source 30, the base is connected to a ground point 32 and the collector is connected to a terminal 34 and the base of transistor 28. The emitter of transistor 28 is connected to the ground point 32 and the collector is connected to a terminal 36. The first transistor 26 is a PNP transistor and the second transistor 28 is an NPN transistor.

As illustrated in FIG. 3, the transistor 26 comprises the substrate layer 10 as its emitter, the first epitaxial layer 12 as its base, and the second epitaxial layer 14 as its collector. Terminal 32 is connected to the base layer 12 through the ring 20. The emitter substrate layer 10 is connected directly to a positive bias at 30. The collector layer 14 of transistor 26 is connected directly to terminal 34 at the surface 18. The second transistor 28 has as its emitter layer 12, its base layer 14, and its collector diffused region 24. Base layer 12 is connected to terminal 32 through diffused ring 20, base layer 14 is connected to terminal 34 at its surface 18, and the diffused collector region 24 is connected at its surface directly to terminal 36.

The P+ substrate is biased positive by applied supply voltage $V_{CC}$. This causes injection from the entire substrate and hence provides a constant current base drive to the NPN transistor 26. The vertical PNP transistor 28 is thus a constant current source. The NPN transistor 26 has an improved upward gain due to the graded impurity layer 14 and surface inversion of layer 14 is prevented by the high impurity surface area 22.

From the preceding description of the preferred embodiments, it is evident that the objects of the invention are obtained, and, although the invention has been described and illustrated in detail, it is to be clearly understood that the same is by way of illustration and example only and is not to be taken by way of limitation. All the N and P layers and regions may be interchanged. The spirit and scope of this invention are to be limited only by the appended claims.

What is claimed is:

1. An integrated circuit having a pair of transistors comprising:
    a substrate of a first conductivity type;
    a first epitaxial layer of conductivity type opposite said first conductivity type on said substrate;
    a second epitaxial layer on said first epitaxial layer of said first conductivity;
    a high impurity concentration of said first conductivity type forming the surface of said second epitaxial layer;
    the remainder of said second epitaxial layer having a substantially linear gradient of impurity concentration decreasing from the boundary with said first epitaxial layer to the boundary with the said high impurity concentration surface;
    a ring of said opposite conductivity type extending through said second layer and partially into said first layer;
    a diffused region of said opposite conductivity type in said surface of said second epitaxial layer within said ring; and
    wherein said substrate, first epitaxial layer and said second epitaxial layer are the emitter, base and collector, respectively, of one of said transistors and said first epitaxial layer, second epitaxial layer and said diffused region are the emitter, base, and collector of the other transistor.

2. The integrated circuit of claim 1 wherein said high impurity concentration surface of said second epitaxial layer is in the range of $10^{18}$ to $10^{19}$ atoms per cubic centimeter and said gradient varies from a concentration at said boundary with said first epitaxial layer of approximately $5 \times 10^{15}$ atoms per cubic centimeter to a concentration at said boundary with said high impurity concentration surface of approximately $1 \times 10^{15}$ atoms per cubic centimeter.

3. The integrated circuit of claim 1 within said high impurity concentration has a depth of approximately three tenths of a micron and constitutes the entire surface of said second epitaxial layer.

4. The integrated circuit of claim 1 wherein said electrodes are connected to said substrate, said second epitaxial layer, said ring, and said diffused region.

* * * * *